United States Patent
Chen et al.

(10) Patent No.: US 10,325,964 B2
(45) Date of Patent: Jun. 18, 2019

(54) OLED MERGED SPACER DEVICE

(71) Applicant: Taiwan Semiconductor Manufacturing Co., Ltd., Hsin-Chu (TW)

(72) Inventors: Yi-Huan Chen, Hsin Chu (TW); Fu-Jier Fan, Hsinchu (TW); Kong-Beng Thei, Pao-Shan Village (TW); Ker-Hsiao Huo, Zhubei (TW); Li-Hsuan Yeh, New Taipei (TW); Yu-Bin Zhao, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/352,172

(22) Filed: Nov. 15, 2016

(65) Prior Publication Data
US 2018/0138250 A1  May 17, 2018

(51) Int. Cl.
*H01L 29/08* (2006.01)
*H01L 27/32* (2006.01)
*H01L 29/78* (2006.01)
*H01L 29/66* (2006.01)
*H01L 29/417* (2006.01)
*H01L 29/49* (2006.01)

(52) U.S. Cl.
CPC ...... *H01L 27/3223* (2013.01); *H01L 27/3225* (2013.01); *H01L 27/3262* (2013.01); *H01L 29/0847* (2013.01); *H01L 29/41775* (2013.01); *H01L 29/4983* (2013.01); *H01L 29/6656* (2013.01); *H01L 29/66545* (2013.01); *H01L 29/66575* (2013.01); *H01L 29/78* (2013.01)

(58) Field of Classification Search
CPC ............ H01L 27/3223; H01L 27/3225; H01L 29/0847
USPC .......................................... 257/40, 368, 401
See application file for complete search history.

(56) References Cited

U.S. PATENT DOCUMENTS

| | | | |
|---|---|---|---|
| 6,259,142 B1 * | 7/2001 | Dawson | H01L 29/66484 257/318 |
| 8,692,320 B2 * | 4/2014 | Gibbons | H01L 21/823425 257/330 |
| 8,803,234 B1 * | 8/2014 | Liao | H01L 29/7833 257/335 |

(Continued)

*Primary Examiner* — Robert T Huber
(74) *Attorney, Agent, or Firm* — Eschweiler & Potashnik, LLC (57) ABSTRACT

The present disclosure relates to an organic light emitting device including a logic device that comprises a dummy pattern and a merged spacer, and an associated fabrication method. In some embodiments, the organic light emitting device is disposed over a substrate. The logic device is coupled to the organic light emitting device, and comprises a pair of source/drain regions disposed within the substrate and separated by a channel region. A gate structure overlies the channel region and comprises a gate electrode and a dummy pattern separated from the gate electrode by a merged spacer. By arranging the dummy pattern and the merged spacer between the gate electrode and the source/drain regions, a distance between the gate electrode and the source/drain region is enlarged, and therefore reducing the gate induced drain leakage (GIDL) effect.

20 Claims, 5 Drawing Sheets

(56) References Cited

U.S. PATENT DOCUMENTS

| | | | |
|---|---|---|---|
| 2005/0045882 A1* | 3/2005 | Park | H01L 27/3244 257/59 |
| 2013/0292763 A1* | 11/2013 | Chang | H01L 29/7816 257/335 |
| 2016/0225907 A1* | 8/2016 | Kim | H01L 29/7869 |

* cited by examiner

OLED MERGED SPACER DEVICE

BACKGROUND

Organic light emitting devices (OLEDs) are becoming increasingly desirable because of the inherent properties of organic materials, such as their flexibility, which makes them well suited for fabrication on a flexible substrate. The OLEDs make use of thin organic films that emit light when voltage is applied across the device. OLEDs are becoming an increasingly popular technology for applications such as flat panel displays, illumination, and backlighting.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The increasingly desirable organic light emitting devices make use of thin organic films that emits light when voltage is applied across the films. The organic light emitting devices are controlled by logic devices, such as medium voltage transistors that operate at a bias range of 8V-10V. As the devices are scaled for different technology nodes, the gate dielectric and channel length are decreased. One of the challenges of the logic devices is their gate induced drain leakage, known as GIDL. GIDL is a leakage mechanism due to band-to-band drain to substrate tunneling current in a field depletion region where gate and drain overlap. GIDL introduces off-state leakage, which poses severe constraints in the device design.

The present disclosure relates to an organic light emitting device including a logic device that comprises a dummy pattern and a merged spacer to extend a distance between a gate electrode and a drain region of the logic device, and an associated fabrication method. In some embodiments, the organic light emitting device is disposed over a substrate. The logic device is coupled to the organic light emitting device, and comprises a pair of source/drain regions disposed within the substrate and separated by a channel region. A gate structure overlies the channel region and comprises a gate electrode and a dummy pattern separated from the gate electrode by a merged spacer. By arranging the dummy pattern and the merged spacer between the gate electrode and the source/drain regions, a distance between the gate electrode and the source/drain region is enlarged, thereby reducing the gate induced drain leakage (GIDL) effect.

Figure 1:
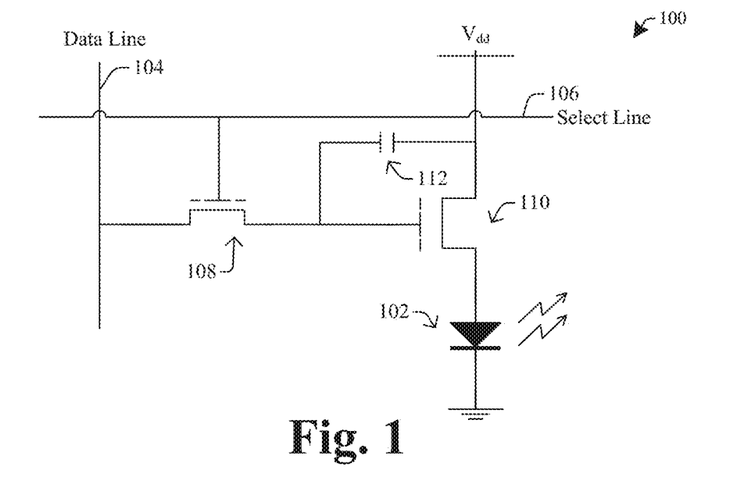
FIG. 1 illustrates a schematic diagram of some embodiments of an integrated circuit including an OLED having a light emitting component and logic devices.

FIG. 1 shows a schematic diagram of an integrated circuit 100 for an OLED device. In some embodiments, the circuit 100 includes an OLED lighting component 102 coupled to logic devices, such as a driving transistor 110 and a select transistor 108. In some embodiments, the select transistor 108 is connected between a data line 104 and a gate electrode of the driving transistor 110. A gate electrode of the select transistor 108 is connected to a select line 106, so that an appropriate voltage applied to the select line 106 will turn on the select transistor 108, allowing a voltage on the data line 104 to be applied to the gate electrode of the driving transistor 110, and turning on the driving transistor 110. In some embodiments, the OLED lighting component 102 has an anode (or cathode) directly connected to one of source/drain regions of the driving transistor 110. In some embodiments, the other source/drain region of the driving transistor 110 is connected to a bias source Vdd. A storage capacitor 112 may be connected between the bias source Vdd and the gate electrode of the driving transistor 110. As a result, when the driving transistor 110 is turned on by the select transistor 108, a sufficient voltage is applied to the driving transistor 110 so that a sufficiently high current can flow through the OLED lighting component 102 to generate light. In some embodiments, the integrated circuit 100 can be a unit module in a matrix display. As will be explained in more detail with subsequent figures, the logic devices, such as the driving transistor 110 or the select transistor 108 may have a dummy pattern arranged next to their gate electrode and separated by a merged spacer, such that the gate electrode and a drain region are spaced apart, thereby reducing the gate induced drain leakage (GIDL) effect and improving efficiency and sensitivity of the OLED device.

Figure 2:
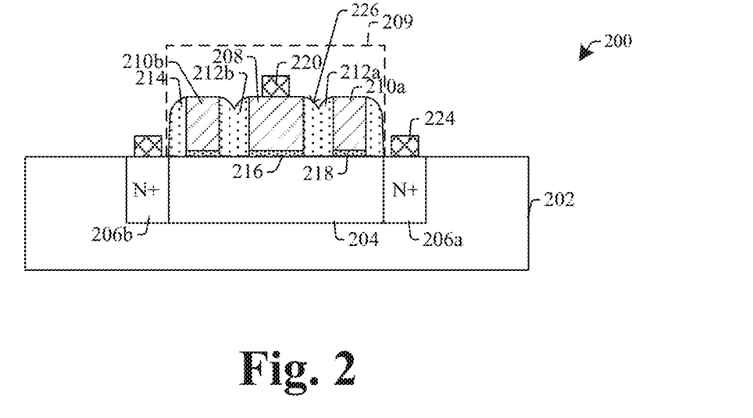
FIG. 2 illustrates a cross-sectional view of some embodiments of a logic device of the integrated circuit of FIG. 1 including a merged spacer.

FIG. 2 illustrates a cross-sectional view of some embodiments of a logic device 200 of the integrated circuit 100 of FIG. 1 including a merged spacer. As mentioned above, the logic device 200 can be a transistor indirectly or directly coupled to an OLED lighting component, such as the driving transistor 110 or the select transistor 108 of FIG. 1. In some embodiments, the logic device 200 comprises a pair of source/drain regions 206a, 206b disposed within a substrate 202. The pair of source/drain regions 206a, 206b is separated by a channel region 204. In some embodiments, the substrate 202 may comprise complementary metal-oxide semiconductor (CMOS) devices that are configured to provide such functions as analog-to-digital conversion, amplification, storage, filtering, etc. In some embodiments, the substrate 202 can be a bulk semiconductor substrate such as a monocrystalline substrate that is lightly doped. The substrate 202 can also be implemented as a binary compound substrate (e.g., GaAs wafer), a ternary compound substrate (e.g., AlGaAs), or higher order compound wafers, among others. Further, the substrate 202 can also include non-semiconductor materials such as oxide in silicon-on-insulator (SOI), partial SOI substrate, polysilicon, amorphous silicon, or organic materials, among others. In some embodiments, the pair of source/drain regions 206a, 206b has a first doping type (e.g., n-type doping) that is different than a second doping type (e.g., p-type doping) of the substrate 202. The channel region 204 may also have the second doping type. The pair of source/drain regions 206a, 206b may have doping concentrations greater than those of the channel region 204 and the substrate 202 (or a body region of the logic device).

A gate structure 209 is disposed over the substrate 202 overlying the channel region 204. The gate structure 209 comprises a gate electrode 208 and a dummy pattern 210 (210a, 210b) set aside the gate electrode 208. In some embodiments, the gate electrode 208 and the dummy pattern 210 comprise the same material, such as polysilicon. In some other embodiments, the gate electrode 208 may comprise highly doped polysilicon or metal or metal composite material. The dummy pattern 210 may comprise a material different from that of the gate electrode 208. Top surfaces of the gate electrode 208 and the dummy pattern 210 may be co-planar. In some embodiments, the dummy pattern 210 comprises a first portion 210a and a second portion 210b set on both sides of the gate electrode 208. In some alternative embodiments, the dummy pattern 210 may only set at one side of the gate electrode 208 (e.g. only the first portion 210a) closer to the drain region of the logic device 200; these embodiments are not shown in the FIG. 2. In some embodiments, a merged spacer 212 is disposed between the gate electrode 208 and the dummy pattern 210. Corresponding to the dummy pattern 210, the merged spacer 212 may also comprise a first portion 212a and a second portion 212b set at both sides of the gate electrode 208, or only one of the portions set at one side of the gate electrode 208 closer to the drain region. The merged spacer 212 may have a recessed top surface 226. The top surface 226 of the merged spacer 212 may be U-shaped, V-shaped, and/or may have a slope that monotonically decreases from a center region to a peripheral region closer to the gate electrode 208 and the dummy pattern 210. In some embodiments, a sidewall spacer 214 is disposed along an outer sidewall of the dummy pattern 210 opposite to the gate electrode 208. The sidewall spacer 214 and the merged spacer 212 may comprise the same dielectric material, such as silicon nitride, silicon oxide or the combination thereof. The sidewall spacer 214 and the merged spacer 212 may have their highest edge aligned one another and further aligned to the top surfaces of the gate electrode 208 or the dummy pattern 210. A gate contact 220 may be coupled to the gate electrode 208 and a pair of source/drain contacts 224 may be coupled to the pair of source/drain regions 206a, 206b. The dummy pattern 210 may have its top surface entirely covered by an interlayer dielectric layer (not shown in FIG. 2) and not coupled to any contacts and not biased during the operation of the logic device 200.

In some embodiments, a gate dielectric 216 is disposed under the gate electrode 208 and separates the gate electrode 208 from the channel region 204. A dummy dielectric 218 is disposed under the dummy pattern 210 and separates the dummy pattern 210 from the channel region 204. In some embodiments, the merged spacer 212 and the sidewall spacer 214 are disposed directly on the substrate 202. The dummy pattern and the merged spacer are arranged between the gate electrode 208 and the source/drain regions 206a, 206b, such that distances between the gate electrode 208 and the source/drain region 206 is enlarged, and therefore GIDL and hot carrier injection can be reduced and device performance can be improved.

Figure 3:
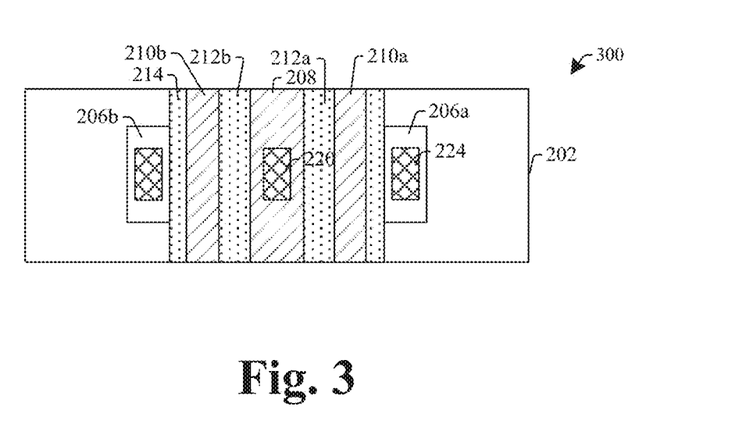
FIG. 3 illustrates a top view of some embodiments of the logic device of FIG. 2 including a merged spacer.

FIG. 3 illustrates a top view of some embodiments of the logic device 200 of FIG. 2. As seen in FIG. 3, the pair of source/drain regions 206a, 206b is disposed within the substrate 202. The gate electrode 208 and the dummy pattern 210 are separated by the merged spacer 212. The sidewall spacer 214 is disposed along an outer sidewall of the dummy pattern 210 opposite to the gate electrode 208. The gate contact 220 and the source/drain contact 224 are respectively arranged on the gate electrode 208 and the source/drain region 206. In some embodiments, the merged spacer 212 abuts the gate electrode 208 and the dummy pattern 210.

FIGS. 4-10 illustrate some embodiments of cross-sectional views 400-1000 showing a method of forming an integrated circuit including a logic device having a dummy pattern and a merged spacer. By forming the dummy patterns together with gate electrodes using one same mask, manufacturing processes are efficiently integrated.

Figure 4:
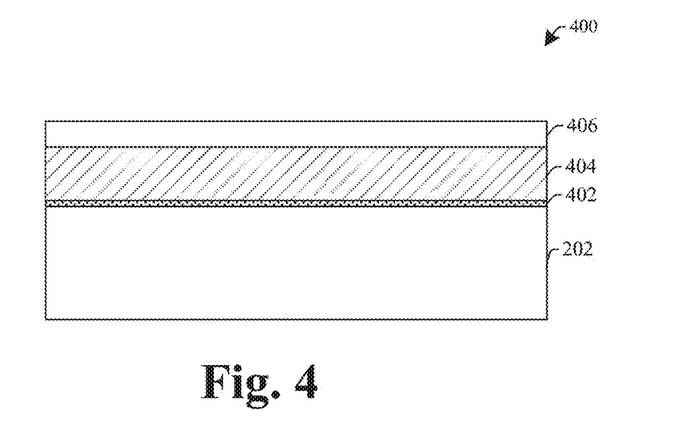
FIGS. 4-10 illustrate some embodiments of cross-sectional views showing a method of forming an integrated circuit including a logic device having a merged spacer.

As shown in cross-sectional view 400 of FIG. 4, a substrate 202 is provided. In various embodiments, the substrate 202 may comprise any type of semiconductor body or thin film (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, a plurality of semiconductor devices and a plurality of metal interconnect layers (arranged within a dielectric structure comprising one or more inter-level dielectric (ILD) layers) can be formed over a substrate to form the substrate 202. The plurality of metal interconnect layers may be formed by forming trench and via openings within an ILD layer, which is selectively exposed to an etchant (e.g., $CF_4$, $CHF_3$, $C_4F_8$, HF, etc.) that etches the ILD layer, followed by filling a conductive metal material such as copper, aluminum, tungsten, etc. into the trench and via openings. In some embodiments, a chemical mechanical polishing (CMP) process may be used to remove excess of the metal material from an upper surface of the ILD layer.

A gate dielectric layer 402 is formed over the substrate 202. The gate dielectric layer 402 comprises an oxide (e.g., $SiO_2$) or other dielectric material, such as a high-k dielectric material, formed by way of a thermal process, spin on process, or by a deposition process (e.g., chemical vapor deposition (CVD), physical vapor deposition (PVD), atomic layer deposition (ALD), etc. A gate layer 404 is formed over the gate dielectric layer 402. The gate layer 404 may comprise polysilicon and formed by way of a deposition process. In some embodiments, a hard mask layer 406 may be formed over the polysilicon gate dielectric layer 402. The hard mask layer may be formed by way of a deposition process and then be patterned by a photoresist mask using a lithography process (as shown in FIG. 5).

Figure 5:
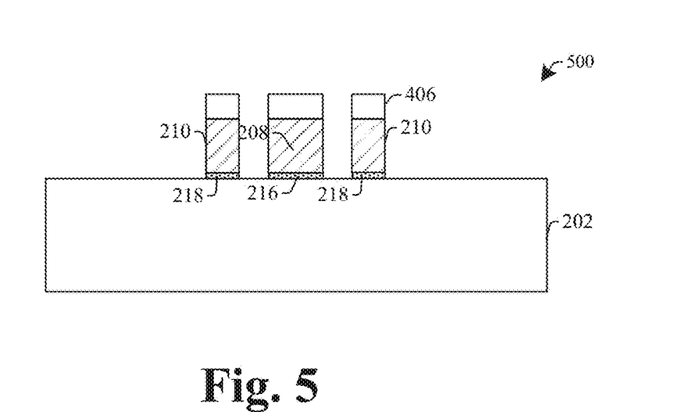

As shown in cross-sectional view 500 of FIG. 5, the gate layer 404 is then patterned according to the hard mask layer 406 to form a gate electrode 208 and a dummy pattern 210. In some embodiments, the gate dielectric layer 402 is also correspondingly patterned to form a gate dielectric 216 and a dummy dielectric 218. In some embodiments, the gate layer 404 and the gate dielectric layer 402 (as shown in FIG. 4) is etched by a series of etching processes including some dry etching processes and/or a wet etching/cleaning process. The gate electrode 208 and the dummy pattern 210 are formed to be separated from each other. In some embodiments, the hard mask layer 406 is subsequently removed, while in some other embodiments, the hard mask layer 406 is left on the gate electrode 208 and the dummy pattern 210, as a result of the patterning process.

Figure 6:
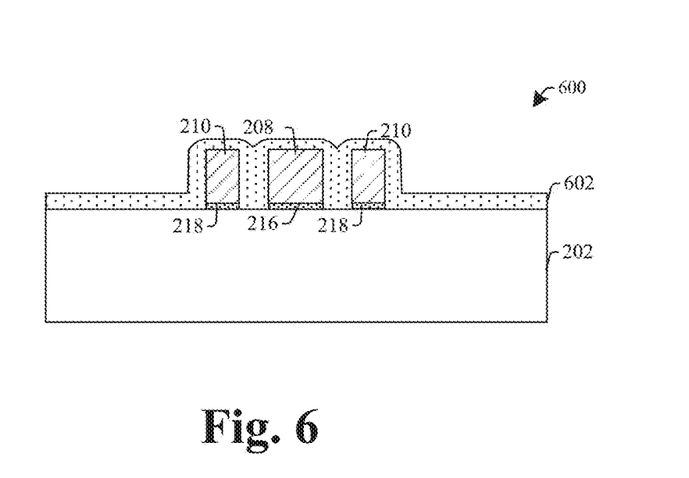

As shown in cross-sectional view 600 of FIG. 6, a protection layer 602 is formed over and along the substrate 202, and lining the gate dielectric 216, the gate electrode 208, the dummy dielectric 218, the dummy pattern 210, and optionally lining the hard mask layer 406 (not shown). The protection layer 602 may be deposited using a conformal deposition technique, such as chemical vapor deposition (CVD). The protection layer 602 may comprise one or multiple layers of dielectric materials such as silicon dioxide, silicon nitride, and silicon carbide.

Figure 7:
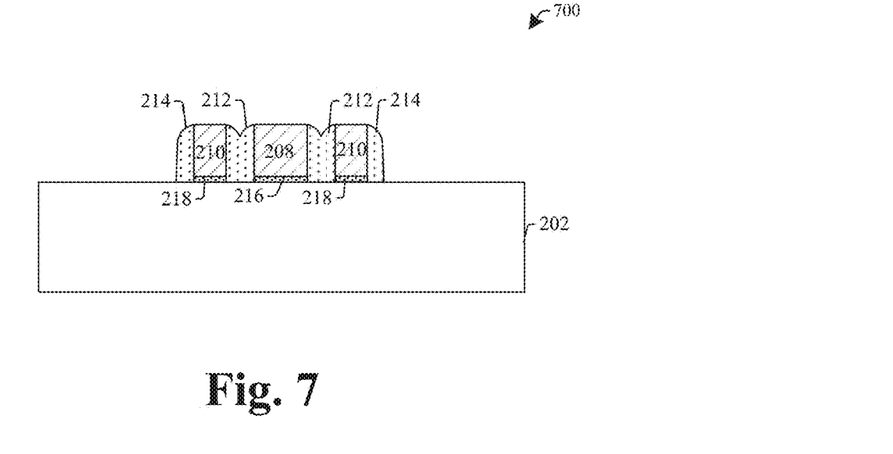

As shown in cross-sectional view 700 of FIG. 7, a vertical etch back process is performed on the protection layer 602. An etchant may be applied to the protection layer 602 for the approximate time it takes the etchant to etch through the thickness of the protection layer 602. The etchant removes lateral stretches of the protection layer 602, thereby resulting in a merged spacer 212 between the gate electrode 208 and the dummy pattern 210 and a sidewall spacer 214 alongside the dummy pattern 210. As a result, the merged spacer 212 may have a recessed top surface with a lowest point at a center region and extending upwardly to top surfaces of the gate electrode 208 and the dummy pattern 210 through half-side convex surfaces. The sidewall spacer 214 may have a half-side convex top surface extending upwardly from an outer side to an inner side abutting the dummy pattern 210.

Figure 8:
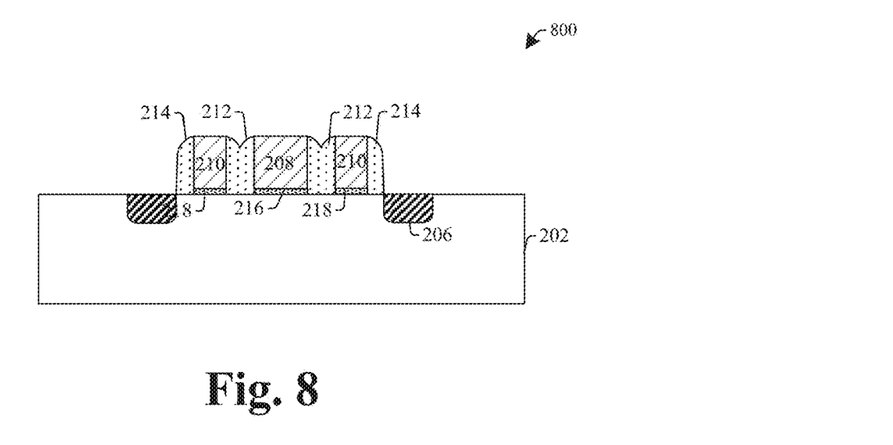

As shown in cross-sectional view 800 of FIG. 8, source/drain regions 206a, 206b are formed within an upper region of the substrate 202 at the opposite sides of the gate electrode 208 and the dummy patterns 210. In some embodiments, the source/drain regions 206a, 206b may be formed by selectively implanting dopant species into the substrate 202 or by forming trenches and filling the trenches by an epitaxial growth process.

Figure 9:
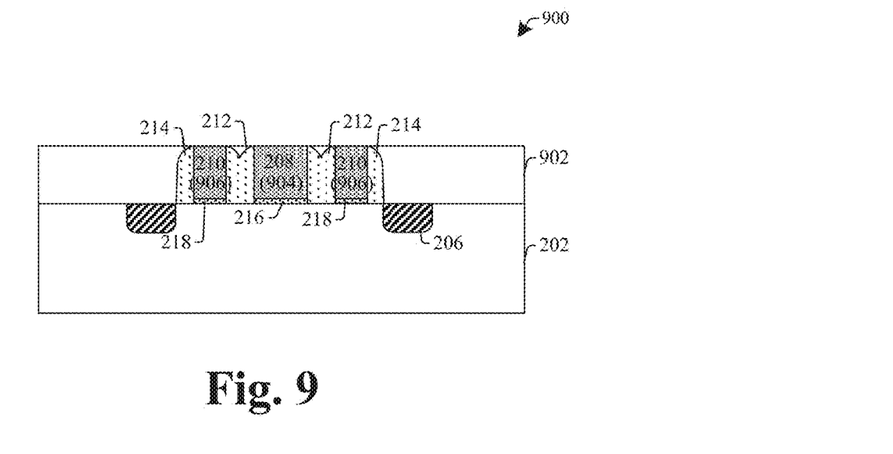

As shown in cross-sectional view 900 of FIG. 9, an interlayer dielectric (ILD) layer 902 is formed over the source/drain regions 206a, 206b. In some embodiments, the interlayer dielectric layer 902 is formed to cover the gate electrode 208, the dummy pattern 210, and the merged spacer 212 there between. In some alternative embodiments, the interlayer dielectric layer 902 is etched back, through a planarization process for example, to expose the gate electrode 208 and/or the dummy pattern 210. A silicidation process may be performed to form a silicide on top of the gate electrode 208 and/or the dummy pattern 210. A replacement gate process may be performed by removing the gate electrode 208 and/or the dummy pattern 210 and filling a metal material or other conductive materials therein (noted as metal gate 904 and metal dummy pattern 906).

Figure 10:
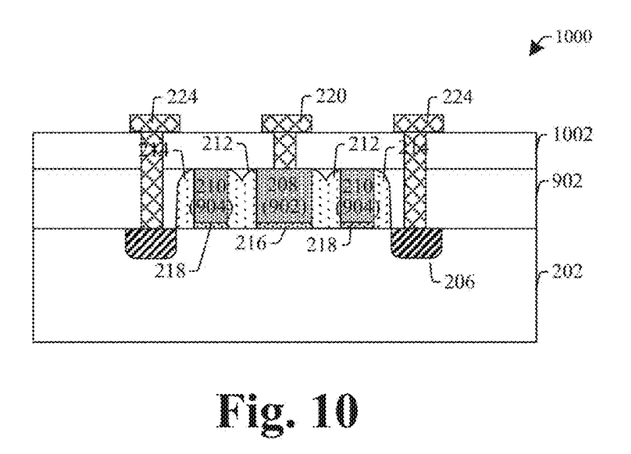

As shown in cross-sectional view 1000 of FIG. 10, a gate contact 220 and a source/drain contact 224 are formed corresponding to the gate electrode 208 and the source/drain region 206. In some embodiments, a protective dielectric layer 1002 is formed over the interlayer dielectric (ILD) layer 902, and conductive vias are formed through the protective dielectric layer 1002 to connect the gate contact 220 and the source/drain contact 224 respectively to the gate electrode 208 and the source/drain region 206. The dummy pattern 210, (or the metal dummy pattern 906, if the replacement gate process is performed) may abut and be covered by the protective dielectric layer 1002.

Figure 11:
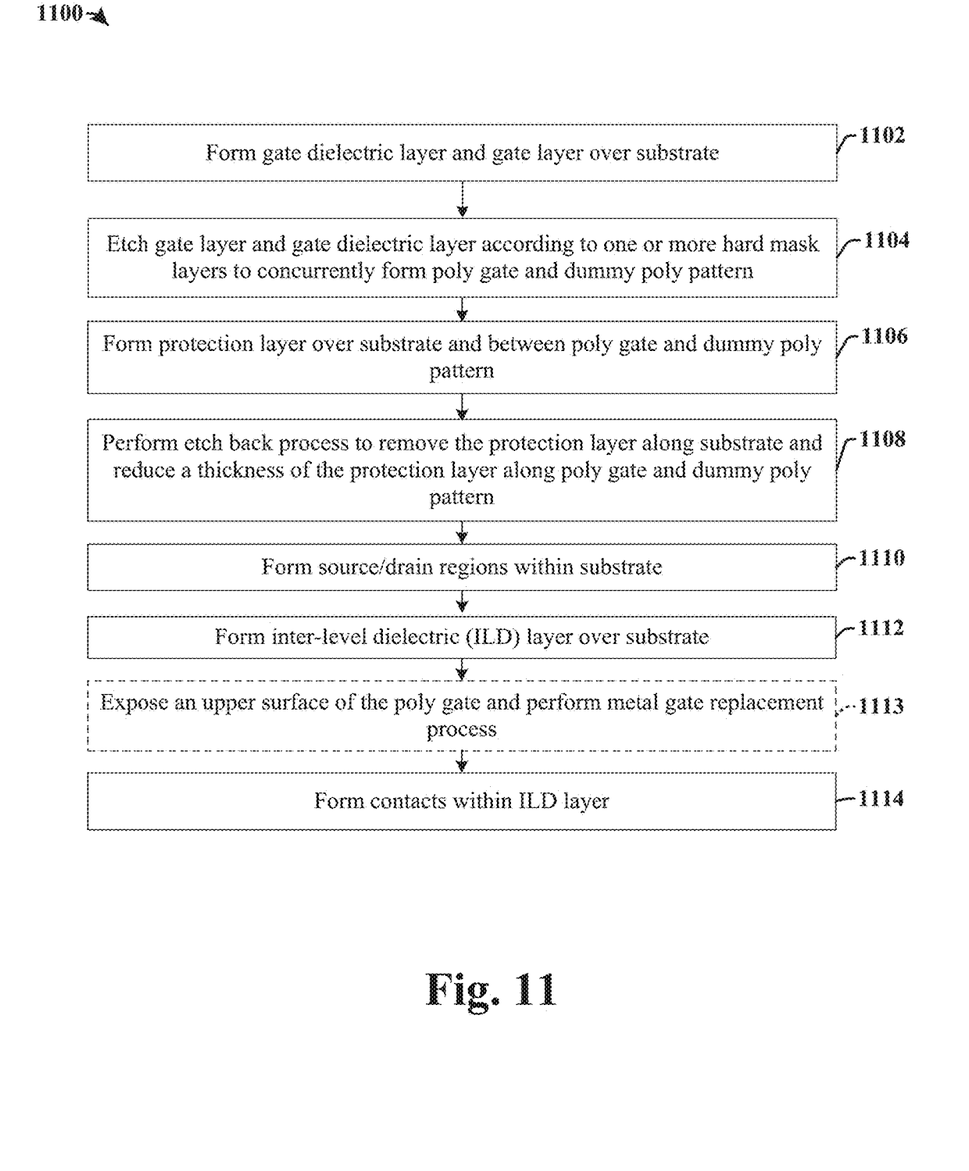
FIG. 11 illustrates a flow diagram of some embodiments of a method of forming an integrated circuit including a logic device having a merged spacer.

FIG. 11 illustrates a flow diagram of some embodiments of a method 1100 of forming an integrated circuit including a logic device having a merged spacer.

Although method 1100 is described in relation to FIGS. 4-10, it will be appreciated that the method 1100 is not limited to such structures disclosed in FIGS. 4-10, but instead may stand alone independent of the structures disclosed in FIGS. 4-10. Similarly, it will be appreciated that the structures disclosed in FIGS. 4-10 are not limited to the method 1100, but instead may stand alone as structures independent of the method 1100.

Also, while disclosed methods (e.g., method 1100) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1102, a gate dielectric layer and a gate layer are formed and patterned over a substrate. The substrate can be a bulk substrate having a plurality of semiconductor devices and a plurality of metal interconnect layers within a plurality of ILD layers or a thin film substrate. A hard mask layer may be formed and patterned over the gate layer and the gate dielectric layer. FIG. 4 illustrates some embodiments of a cross-sectional view 400 corresponding to act 1102.

At 1104, the gate layer is patterned to concurrently form a gate electrode and a pair of dummy patterns at opposite sides of the gate electrode and separated from the gate electrode. In some embodiments, the gate dielectric layer is also correspondingly patterned to form a gate dielectric under the gate electrode and dummy dielectrics underneath the dummy patterns. In some embodiments, the gate layer and the gate dielectric layer is etched by a series of etching processes including some dry etching processes and/or a wet etching/cleaning process. FIG. 5 illustrates some embodiments of a cross-sectional view 500 corresponding to act 1104.

At 1106, a protection layer is conformally formed over and along the substrate, and lining the gate electrode and the dummy patterns, and filling spaces between the gate electrode and the dummy patterns. In some embodiments, the protection layer is formed directly on the substrate. The protection layer can be formed by a deposition process (e.g., chemical vapor deposition (CVD), physical vapor deposition (PVD), atomic layer deposition (ALD), etc. The protection layer may have two vertical portions lining neighbored gate electrode and dummy patterns that partially are merged together, resulting in a recessed upper surface at corresponding positions. FIG. 6 illustrates some embodiments of a cross-sectional view 600 corresponding to act 1106.

At 1108, a vertical etch back process is performed to the protection layer to remove lateral portions of the protection layer along the substrate and to leave vertical portions alongside the gate electrode and the dummy patterns, thereby resulting in a merged spacer between the gate electrode and the dummy pattern and a sidewall spacer alongside the dummy pattern. The recessed upper surface of the protection layer is uniformly lowered as a recessed top surface of the merged spacer that have with a lowest point at a center region and extending upwardly to top surfaces of the gate electrode and the dummy pattern. FIG. 7 illustrates some embodiments of a cross-sectional view 700 corresponding to act 1108.

At 1110, source/drain regions are formed within an upper region of the substrate at the opposite sides of the gate electrode and the dummy patterns. In some embodiments, the source/drain regions may be formed by selectively implanting dopant species into the substrate or by forming trenches and filling the trenches by an epitaxial growth process. FIG. 8 illustrates some embodiments of a cross-sectional view 800 corresponding to act 1110.

At 1112, an interlayer dielectric (ILD) layer is formed over the source/drain regions. In some embodiments, the interlayer dielectric layer is formed to cover the gate electrode, the dummy pattern and the merged spacer. Optionally, at 1113, the gate electrode, the gate dielectric, the dummy pattern, and/or the dummy dielectric are exposed and removed to form trench spaces. A new gate dielectric material, and/or a new conductive material is filled into the trench spaces. FIG. 9 illustrates some embodiments of a cross-sectional view 900 corresponding to act 1112 and act 1113.

At 1114, a gate contact and a source/drain contact are formed corresponding to the gate electrode and the source/drain region. In some embodiments, a protective dielectric layer is formed over the interlayer dielectric (ILD) layer, and conductive vias are formed through the protective dielectric layer to connect the gate contact and the source/drain contact respectively to the gate electrode and the source/drain region. The dummy pattern (or the metal dummy pattern, if the replacement gate process is performed) may abut and be covered by the protective dielectric layer. FIG. 10 illustrates some embodiments of a cross-sectional view 1000 corresponding to act 1114.

Therefore, the present disclosure relates to an integrated circuit that comprises a dummy pattern and a merged spacer next to a gate electrode, and a method to form the dummy pattern and the gate electrode concurrently. By forming the dummy pattern and the merged spacer, a distance between a gate electrode and a source/drain region of a logic device of an OLED device is enlarged and a current leakage is reduced.

In some embodiments, the present disclosure relates to an integrated circuit. The integrated circuit comprises an organic light emitting device (OLED) disposed over a substrate and a transistor coupled to the organic light emitting device. The transistor comprises a pair of source/drain regions disposed within the substrate and separated by a channel region, and a gate structure overlying the channel region. The gate structure comprises a gate electrode and a dummy pattern separated from the gate electrode by a merged spacer.

In other embodiments, the present disclosure relates to an integrated circuit including an organic light emitting device (OLED). The integrated circuit comprises a pair of source/drain regions disposed a substrate and a gate structure disposed between the pair of source/drain regions and over the substrate. The gate structure comprises a gate electrode separated from the substrate by a gate dielectric, and a dummy pattern set aside from the gate electrode. A merged spacer is disposed between and abutting the gate electrode and the dummy pattern.

In yet other embodiments, the present disclosure relates to a method for manufacturing an integrated circuit including an organic light emitting device (OLED). The method comprises forming a gate dielectric layer and a polysilicon layer over a substrate. The method further comprises patterning the polysilicon layer and the gate dielectric layer according to one or more hard mask layers to concurrently form poly gate and dummy poly pattern. The method further comprises forming a protection layer over the substrate and between the poly gate and the dummy poly pattern. The method further comprises performing an etch back process to remove the protection layer along the substrate and reduce a thickness of the protection layer along the poly gate and the dummy poly pattern to form a merged spacer between the poly gate and the dummy poly pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   an organic light emitting device (OLED) disposed over a substrate;
   a transistor coupled to the organic light emitting device, the transistor comprising a pair of source/drain regions disposed within the substrate and separated by a channel region, and a gate structure overlying the channel region;
   an interlayer dielectric layer over the source/drain regions surrounding the gate structure; and
   a protective dielectric layer over the interlayer dielectric layer and the gate structure;
   wherein the gate structure comprises a gate electrode and a dummy pattern disposed between the pair of source/drain regions and separated from the gate electrode by a merged spacer;
   wherein the dummy pattern comprises a first portion set on one side of the gate electrode and a second portion set on another side of the gate electrode opposite to the first portion;
   wherein the dummy pattern has its top surface directly contacting and entirely covered by the protective dielectric layer.

2. The integrated circuit of claim 1, wherein the merged spacer has a U-shaped or V-shaped top surface.

3. The integrated circuit of claim 1, wherein the dummy pattern comprises a material different from that of the gate electrode.

4. The integrated circuit of claim 1, wherein top surfaces of the gate electrode and the dummy pattern are laterally aligned.

5. The integrated circuit of claim 1, wherein a top surface of the merged spacer has a slope that monotonically decreases from a center region to a peripheral region closing to the gate electrode and the dummy pattern.

6. The integrated circuit of claim 1, further comprises a sidewall spacer along an outer sidewall of the dummy pattern opposite to the gate electrode.

7. The integrated circuit of claim 6, wherein the sidewall spacer and the merged spacer comprise the same dielectric material.

8. The integrated circuit of claim 6, wherein the merged spacer comprises silicon nitride.

9. The integrated circuit of claim 1, further comprises a gate dielectric separating the gate electrode from the channel region, and a dummy dielectric separating the dummy pattern from the channel region.

10. The integrated circuit of claim 1, wherein the merged spacer is disposed directly on the substrate.

11. An integrated circuit including an organic light emitting device (OLED), comprising:
a pair of source/drain regions disposed over a substrate;
a gate structure of a logic device disposed between the pair of source/drain regions and over the substrate, the gate structure comprising a gate electrode separated from the substrate by a gate dielectric, and a dummy pattern set aside from the gate electrode and between the pair of source/drain regions an interlayer dielectric layer over the source/drain regions surrounding the gate structure;
a protective dielectric layer over the interlayer dielectric layer and the gate structure; and
a merged spacer disposed between and abutting the gate electrode and the dummy pattern;
wherein the dummy pattern comprises a first portion set on one side of the gate electrode and separated from the gate structure by a first portion of the merged spacer, and a second portion set on another side of the gate electrode opposite to the first portion and separated from the gate structure by a second portion of the merged spacer;
wherein the dummy pattern has its top surface entirely covered by the protective dielectric layer to maintain the dummy pattern in a floating state during operation of the logic device;
wherein the gate electrode has a first portion of its top surface covered by the protective dielectric layer and a second portion left uncovered by the protective dielectric layer, and a gate contact extends through the protective dielectric layer to contact the second portion of the top surface of the gate electrode.

12. The integrated circuit of claim 11, wherein a top surface of the merged spacer has a slope that monotonically decreases from a center region to a peripheral region closing to the gate electrode and the dummy pattern.

13. The integrated circuit of claim 11, wherein the gate electrode and the dummy pattern comprise polysilicon.

14. The integrated circuit of claim 11, wherein the dummy pattern is separated from the substrate by a dummy dielectric.

15. The integrated circuit of claim 11, wherein the merged spacer is disposed directly on the substrate.

16. The integrated circuit of claim 11, wherein top surfaces of the gate electrode and the dummy pattern are laterally aligned.

17. The integrated circuit of claim 11, further comprising:
a sidewall spacer along an outer sidewall of the dummy pattern opposite to the gate electrode;
wherein the merged spacer and the sidewall spacer comprise the same dielectric material.

18. An integrated circuit including an organic light emitting device (OLED), comprising:
a pair of source/drain regions disposed over a substrate; and
a gate structure disposed between the pair of source/drain regions and over the substrate, the gate structure comprising a gate electrode separated from the substrate by a gate dielectric, and a dummy pattern disposed between the pair of source/drain regions aside from the gate electrode and separated from the substrate by a dummy dielectric;
an interlayer dielectric layer over the source/drain regions surrounding the gate structure;
a protective dielectric layer over the interlayer dielectric layer and the gate structure;
wherein the gate electrode and the dummy pattern are made of the same material and are both disposed overlying a channel region;
wherein the dummy pattern has a lateral width smaller than that of the gate electrode and has its top surface entirely covered by a protective dielectric layer;
wherein the gate electrode is electrically coupled to a gate contact and the dummy pattern is not coupled to any contacts;
wherein the dummy pattern comprises a first portion set on one side of the gate electrode and a second portion set on another side of the gate electrode opposite to the first portion.

19. The integrated circuit of claim 18, further comprising:
a merged spacer disposed directly on the substrate and between and abutting the gate electrode and the dummy pattern;
wherein a top surface of the merged spacer has a concave shape.

20. The integrated circuit of claim 19, further comprising:
a sidewall spacer along an outer sidewall of the dummy pattern opposite to the gate electrode;
wherein the gate electrode, the dummy pattern, the merged spacer, and the sidewall spacer have a substantially same height from a surface of the substrate.

* * * * *